United States Patent
Tsou

(10) Patent No.: US 8,513,820 B2
(45) Date of Patent: Aug. 20, 2013

(54) PACKAGE SUBSTRATE STRUCTURE AND CHIP PACKAGE STRUCTURE AND MANUFACTURING PROCESS THEREOF

(75) Inventor: Wen-Chieh Tsou, Taipei (TW)

(73) Assignee: Everlight Electronics Co., Ltd., New Taipei (TW)

( * ) Notice: Subject to any disclaimer, the term of this patent is extended or adjusted under 35 U.S.C. 154(b) by 357 days.

(21) Appl. No.: 12/691,722

(22) Filed: Jan. 21, 2010

(65) Prior Publication Data
US 2010/0187674 A1    Jul. 29, 2010

(30) Foreign Application Priority Data
Jan. 23, 2009   (TW) ............................... 98102945 A

(51) Int. Cl.
*H01L 23/28* (2006.01)
(52) U.S. Cl.
USPC ........................................................ 257/787
(58) Field of Classification Search
USPC .................. 257/690–692, 787, 778, E23.141
See application file for complete search history.

(56) References Cited

U.S. PATENT DOCUMENTS

| | | |
|---|---|---|
| 2002/0025607 A1 | 2/2002 | Danno et al. |
| 2004/0163843 A1 | 8/2004 | Shin et al. |
| 2010/0308474 A1* | 12/2010 | Shibuya et al. ............... 257/778 |

FOREIGN PATENT DOCUMENTS

| | | |
|---|---|---|
| CN | 2901576 | 5/2007 |
| CN | 1996565 | 7/2007 |
| CN | 101145552 | 3/2008 |
| TW | 441054 | 6/2001 |
| TW | 444362 | 7/2001 |
| TW | I240393 | 9/2005 |
| TW | I244150 | 11/2005 |
| TW | I267929 | 12/2006 |
| TW | 200733431 | 9/2007 |
| TW | 200735237 | 9/2007 |

OTHER PUBLICATIONS

"Search Report of European Counterpart Application", issued on Apr. 28, 2011, p. 1-p. 7, in which the listed reference was cited.

* cited by examiner

*Primary Examiner* — Hoa B Trinh
(74) *Attorney, Agent, or Firm* — Jianq Chyun IP Office

(57) ABSTRACT

A chip package structure includes a substrate, chips and an elastic element. The substrate has a first surface, a second surface, a first patterned metal layer on the first surface and a second patterned metal layer on the second surface, wherein the substrate is suitable for being clipped between an upper mold chase and a lower mold chase of a package mold. The chips are disposed on the first surface, wherein the chips are suitable for being contained in containing spaces defined by the upper mold chase and the substrate. The elastic element is disposed on the second surface and surrounds the second patterned metal layer, wherein the elastic element is suitable for contacting the lower mold chase and is located between the lower mold chase and the substrate. In addition, a manufacturing process of the chip package and a package substrate structure are also provided.

7 Claims, 4 Drawing Sheets

PACKAGE SUBSTRATE STRUCTURE AND CHIP PACKAGE STRUCTURE AND MANUFACTURING PROCESS THEREOF

BACKGROUND OF THE INVENTION

1. Field of the Invention

The present invention relates to a semiconductor device and a manufacturing method thereof. More particularly, the present invention relates to a package substrate structure and a chip package structure, and a manufacturing process thereof.

2. Description of Related Art

In the semiconductor industry, the fabrication of integrated circuits (IC) can be divided into three phases: wafer fabrication, IC fabrication process and IC packaging, etc. Each chip is fabricated through wafer fabrication, circuit design, photolithography and etching processes, and wafer dicing, etc. After each chip formed based on the wafer dicing is electrically connected to external signals through a bonding pad on the chip, the chip can be encapsulated by a sealant material. The packaging process protects the chip from heat, humidity, and noises and provides an electrical connection medium between the chip and external circuits. By such means, packaging of the IC is completed.

Generally, a chip package structure includes a chip, a substrate, a plurality of bonding wires and a molding compound, wherein the chip has an active surface and a back surface opposite to the active surface. Moreover, the substrate is connected to the back surface of the chip to carry the chip, and the bonding wires are electrically connected between the chip and the substrate. The molding compound is disposed on the substrate for wrapping the bonding wires and the chip.

During a manufacturing process of the chip package, due to an uneven structure of a contact area between the substrate and a package mold, a gap can be generated at the contact area. In detail, reasons that causes the uneven structure of the contact area between the substrate and the package mold include: warpage of the substrate, uneven thickness of the substrate, substrate deformation due to excessive force exerted to the substrate by the package mold, un-tight lamination between the substrate and the package mold due to inadequate force exerted to the substrate by the package mold, and uneven surface of the package mold due to residual glue thereon. Influenced by one of the above reasons, when the semi-melting state sealant material is injected to the package mold, it can be infiltrated into the gap, and such phenomenon is referred to as excessive glue. The sealant material infiltrated in the gap can be attached to a conductive part of the chip package structure to insulate the conductive part, so that a following manufacturing process can be influenced.

SUMMARY OF THE INVENTION

The present invention is directed to a package substrate structure, by which occurrence of excessive glue can be reduced during a manufacturing process of the chip package.

The present invention is directed to a chip package structure, by which occurrence of excessive glue can be reduced during a manufacturing process of the chip package.

The present invention is directed to a manufacturing process of a chip package, which can reduce occurrence of excessive glue.

The present invention provides a package substrate structure suitable for being clipped between an upper mold chase and a lower mold chase of a package mold to perform a packaging process. The package substrate structure includes a substrate and an elastic element. The substrate has a first surface, a second surface, a first patterned metal layer on the first surface and a second patterned metal layer on the second surface, wherein the substrate is suitable for being clipped between the upper mold chase and the lower mold chase of the package mold. The elastic element is disposed on the second surface and surrounds the second patterned metal layer, wherein the elastic element is suitable for contacting the lower mold chase and is located between the lower mold chase and the substrate.

The present invention provides a chip package structure suitable for being clipped between an upper mold chase and a lower mold chase of a package mold to perform a packaging process. The chip package structure includes a substrate, a plurality of chips and an elastic element. The substrate has a first surface, a second surface, a first patterned metal layer on the first surface and a second patterned metal layer on the second surface, wherein the substrate is suitable for being clipped between the upper mold chase and the lower mold chase of the package mold. The chips are disposed on the first surface of the substrate in an array, and are electrically connected to the first patterned metal layer, wherein the chips are suitable for being contained in a plurality of containing spaces defined by the upper mold chase and the substrate. The elastic element is disposed on the second surface and surrounds the second patterned metal layer, wherein the elastic element is suitable for contacting the lower mold chase and is located between the lower mold chase and the substrate.

In an embodiment of the present invention, a material of the elastic element is resin.

In an embodiment of the present invention, the upper mold chase defines a plurality of molding cavities corresponding to the containing spaces around the substrate.

In an embodiment of the present invention, the chip package structure further includes a plurality of bonding wires electrically connected between the chips and the first patterned metal layer.

The present invention provides a manufacturing process of a chip package. First, a substrate having a first surface and a second surface opposite to the first surface is provided, wherein the substrate has a first patterned metal layer located on the first surface and a second patterned metal layer located on the second surface. Next, an elastic element is formed on the second surface for surrounding the second patterned metal layer. Next, a plurality of chips is disposed on the first surface. Next, the substrate is clipped between an upper mold chase and a lower mold chase of a package mold, so that the chips are contained in a plurality of containing spaces defined by the upper mold chase and the substrate, and the elastic element contacts the lower mold chase and is clipped between the lower mold chase and the substrate. Next, a sealant material is filled in the containing spaces to form a plurality of molding compounds covering the chips and the first patterned metal layer. Next, the substrate and the molding compounds are cut to form a plurality of independent chip package structures.

In an embodiment of the present invention, a method of forming the elastic element on the second surface includes providing a ring-shape resin and disposing the ring-shape resin on the second surface.

In an embodiment of the present invention, a method of filling the sealant material in the containing spaces includes filling the sealant material in the containing spaces through a plurality of molding cavities corresponding to the containing spaces that is defined by the upper mold chase around the substrate.

In an embodiment of the present invention, after the chips are disposed on the first surface, the manufacturing process of the chip package structure further includes a bonding wire manufacturing process to form a plurality of bonding wires electrically connected between the chips and the first patterned metal layer.

In the present invention, the elastic element is disposed on the package substrate, so that during the manufacturing process of the chip package, a gap cannot be generated at a contact area between the elastic element and the lower mold chase due to elastic deformation of the elastic element, so that occurrence of the excessive glue can be reduced.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
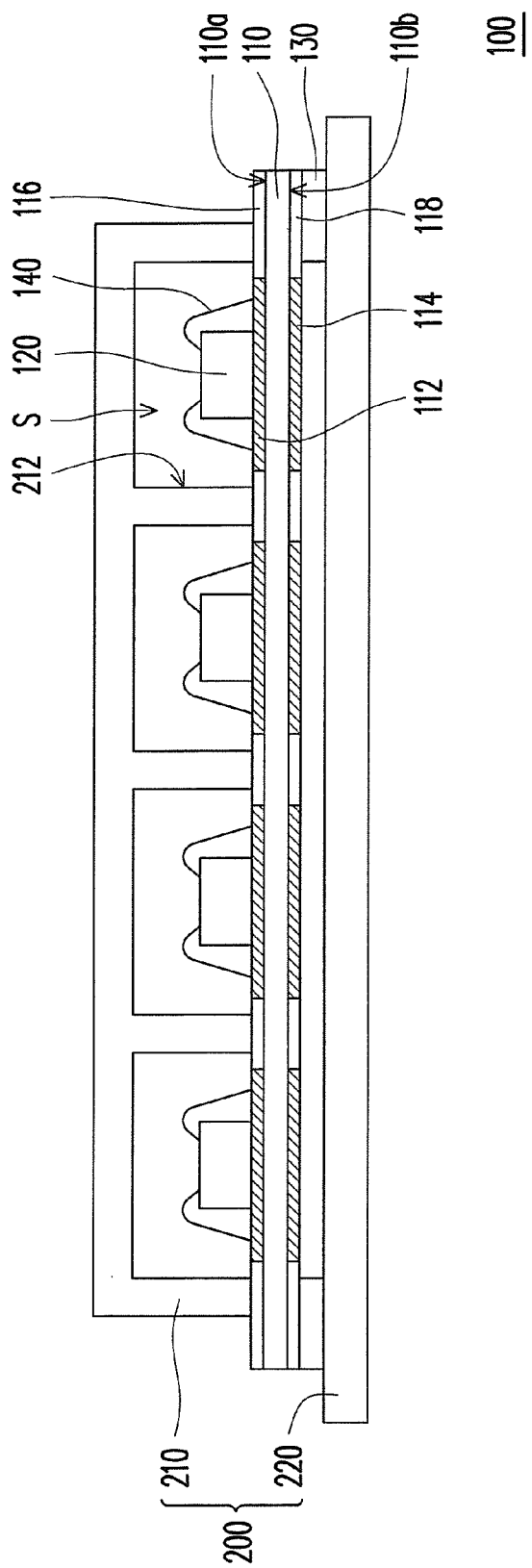
FIG. 1 is a cross-sectional view of a chip package structure according to an embodiment of the present invention.
Figure 2:
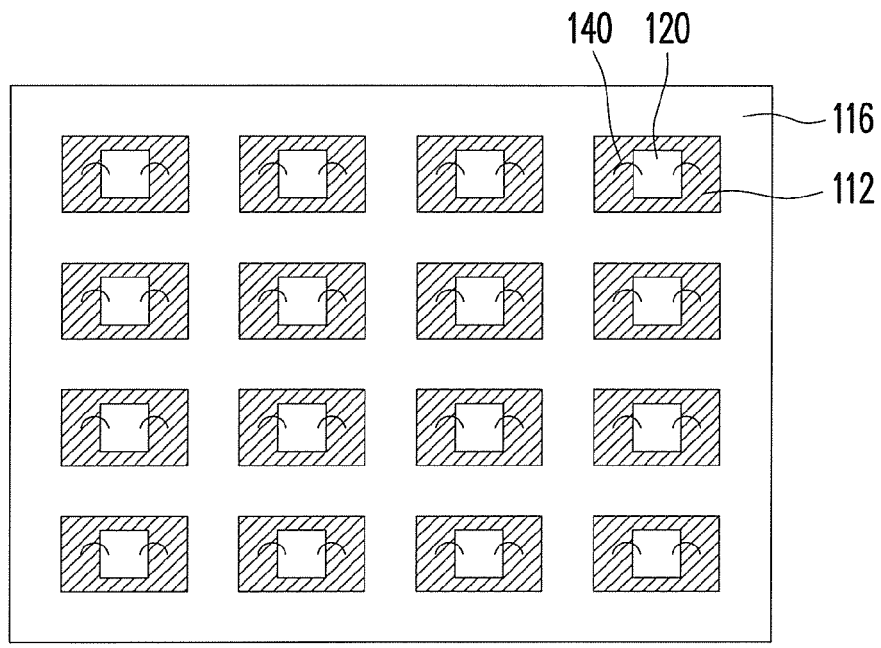
FIG. 2 is a top view of a chip package structure of FIG. 1.
Figure 3:
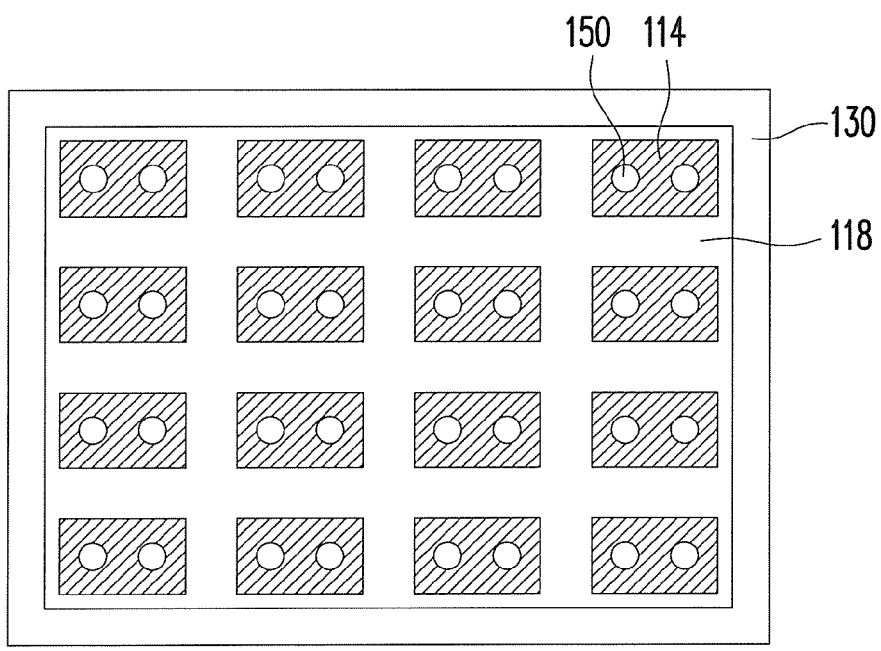
FIG. 3 is a bottom view of a chip package structure of FIG. 1.

FIG. 1 is a cross-sectional view of a chip package structure according to an embodiment of the present invention, FIG. 2 is a top view of the chip package structure of FIG. 1, and FIG. 3 is a bottom view of the chip package structure of FIG. 1. Referring to FIG. 1, FIG. 2 and FIG. 3, the chip package structure 100 of the present embodiment is suitable for being clipped between an upper mold chase 210 and a lower mold chase 220 of a package mold 200 to perform a packaging process. The chip package structure 100 includes a substrate 110, a plurality of chips 120 and an elastic element 130.

The substrate 100 has a first surface 110a, a second surface 110b, a first patterned metal layer 112 on the first surface 110a and a second patterned metal layer 114 on the second surface 110b, wherein the substrate 110 is suitable for being clipped between the upper mold chase 210 and the lower mold chase 220 of the package mold 200. The chips 120 are disposed on the first surface 110a of the substrate 110 in an array, and are electrically connected to the first patterned metal layer 112, wherein the chips 120 are suitable for being contained in a plurality of containing spaces S defined by the upper mold chase 210 and the substrate 110. The elastic element 130 is disposed on the second surface 110b and surrounds the second patterned metal layer 114, wherein the elastic element 130 contacts the lower mold chase 220 and is located between the lower mold chase 220 and the substrate 110.

In the present embodiment, a material of the elastic element 130 is, for example, resin, rubber or foam. Due to deformation of the elastic element 130, a gap cannot be generated between the elastic element 130 and the lower mold chase 220. In detail, phenomenon such as: warpage of the substrate 110, uneven thickness of the substrate 110, deformation of the substrate 110 due to excessive force exerted to the substrate 110 by the package mold 200, un-tight lamination between the substrate 110 and the lower mold chase 220 due to inadequate force exerted to the substrate 110 by the package mold 200, or an uneven surface of the lower mold chase 220 due to residual glue thereon can all lead to uneven spaces of a contact area between the lower mold chase 220 and a surrounding region of the substrate 110, so that the gap can be generated there between. In allusion to the uneven spaces of the contact area, the spaces between the lower mold chase 220 and the surrounding region of the substrate 110 can be eliminated according to different elastic deformations of the elastic element 130 at different parts, so that occurrence of the gap can be avoided. Moreover, due to a soft characteristic of the elastic element 130, when the lower mold chase 220 or the substrate 110 is pressed to the elastic element 130, damage occurred to the lower mold chase 220 or the substrate 110 can be avoided.

Referring to FIG. 1, the upper mold chase 210 is suitable for defining a plurality of molding cavities 212 corresponding to the containing spaces S around the substrate 110, and during the manufacturing process of the chip package structure, a sealant material can be filled in the containing spaces S through the molding cavities 212.

Referring to FIG. 1, FIG. 2 and FIG. 3, the chip package structure 100 further includes a plurality of bonding wires 140 electrically connected between the chips 120 and the first patterned metal layer 112. The substrate 110 further has a first solder mask layer 116 and a second solder mask layer 118 respectively covering a part of the first surface 110a exposed by the first patterned metal layer 112 and a part of the second surface 110b exposed by the second patterned metal layer 114. Referring to FIG. 3, the chip package structure 100 further includes a plurality of conductive holes 150, which are used for conducting the first patterned metal layer 112 and the second patterned metal layer 114.

FIG. 4A to FIG. 4D are cross-sectional views of a manufacturing process for a chip package according to an embodiment of the present invention. The manufacturing process of the chip package is described below with reference of FIG. 4A to FIG. 4D and FIG. 1.

Figure 4A:
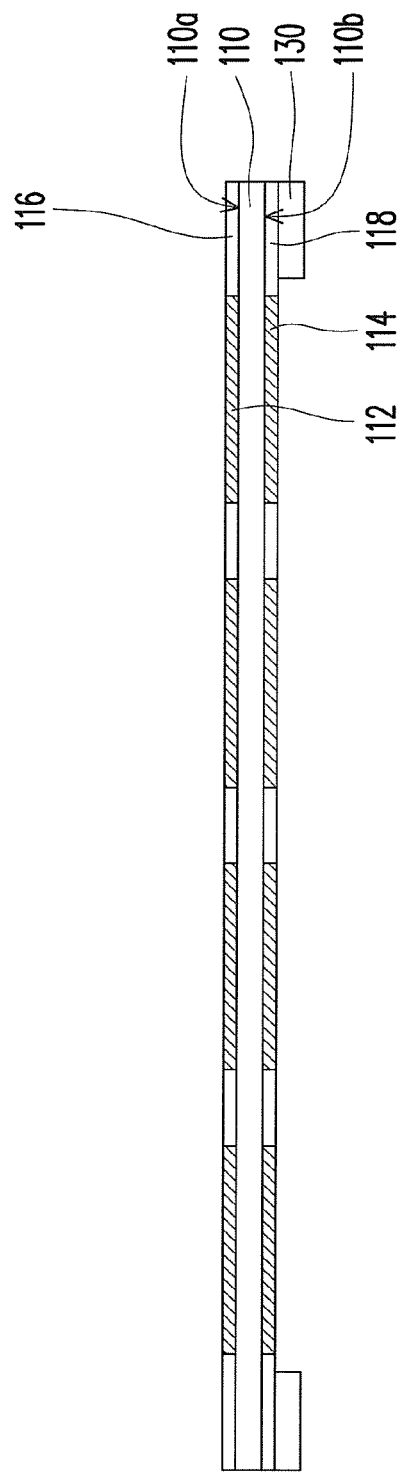
FIG. 4A to FIG. 4D are cross-sectional views of a manufacturing process for a chip package according to an embodiment of the present invention.

First, referring to FIG. 4A, the substrate 110 having the first surface 110a and the second surface 110b opposite to the first surface 110a is provided, wherein the substrate 110 has the first patterned metal layer 112 located on the first surface 110a and the second patterned metal layer 114 located on the second surface 110b. Next, the elastic element 130 is formed on the second surface 114 for surrounding the second patterned metal layer 114. In the present embodiment, a method of forming the elastic element 130 on the second surface 110b is to provide a ring-shape resin, and dispose the ring-shape resin on the second surface 110b.

Figure 4B:
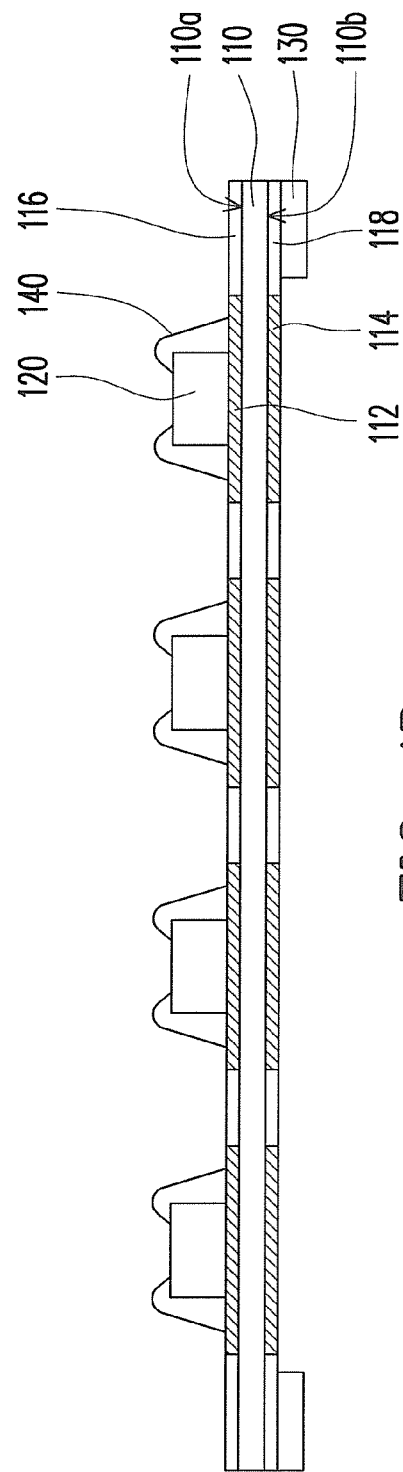
Figure 4C:
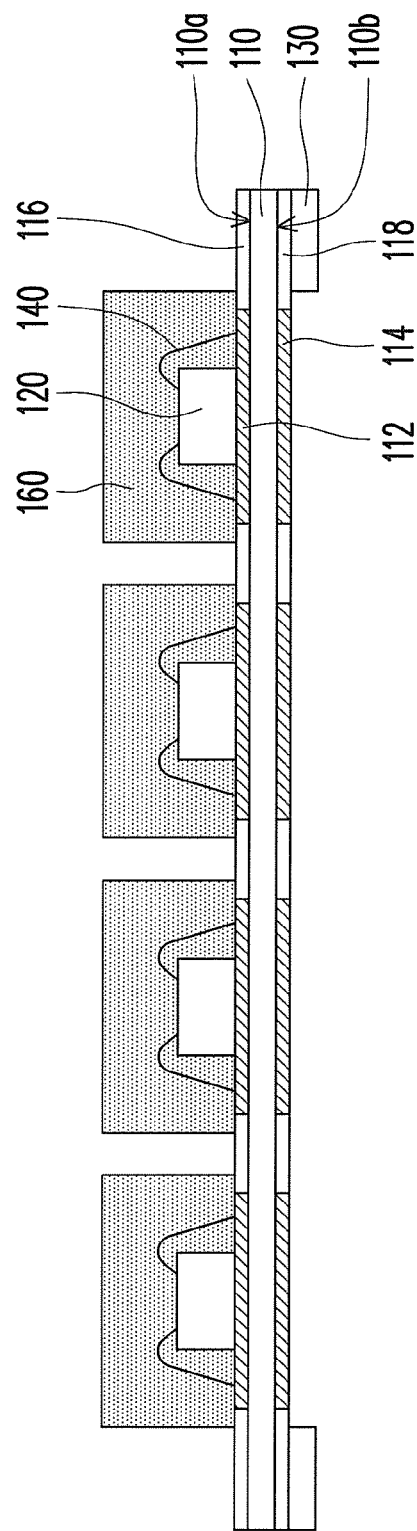
Figure 4D:
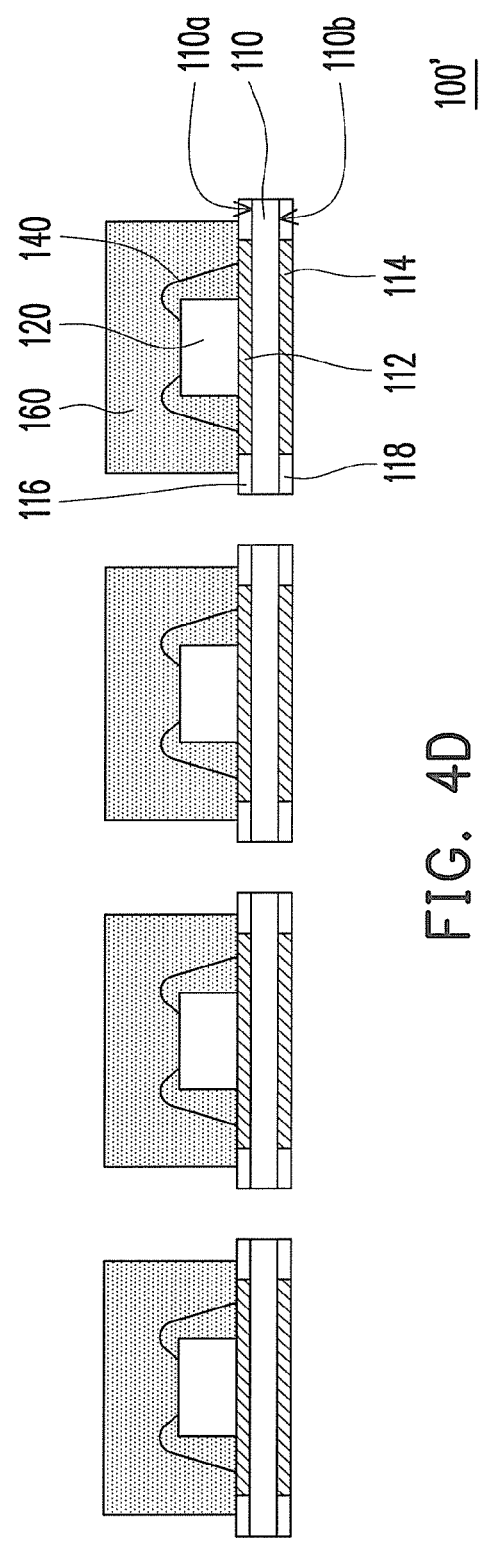

Next, referring to FIG. 4B, a plurality of the chips 120 is disposed on the first surface 110a, and a plurality of the bonding wires 140 electrically connected between the chips 120 and the first patterned metal layer 112 is formed based on a bonding wire manufacturing process. Next, sequentially referring to FIG. 1 and FIG. 4C, the substrate 110 is clipped between the upper mold chase 210 and the lower mold chase 220 of the package mold 200, so that the chips 120 are contained in a plurality of the containing spaces S defined by the upper mold chase 210 and the substrate 110, and the elastic element 130 contacts the lower mold chase 220, and is clipped between the lower mold chase 220 and the substrate 110. Next, a sealant material is filled in the containing spaces S to foam a plurality of molding compounds 160 covering the chips 120 and the first patterned metal layer 112.

Referring to FIG. 1, in the present embodiment, a method of filling the sealant material in the containing spaces S includes filling the sealant material in the containing spaces S through a plurality of the molding cavities 212 corresponding to the containing spaces S that is defined by the upper mold chase 210 around the substrate 110. It should be noted that during such process, a gap cannot be generated between the elastic element 130 and the lower mold chase 220 due to the elastic deformation of the elastic element 130, so that the sealant material cannot be infiltrated to a region of the second surface 110b and covers the second patterned metal layer 114. Finally, referring to FIG. 4D, the substrate 110 and the molding compounds 160 are cut to form a plurality of independent chip package structures 100'.

In summary, the elastic element is disposed on the package substrate. During the manufacturing process of the chip package, a gap cannot be generated at a contact area between the elastic element and the lower mold chase due to the elastic deformation of the elastic element, so that a chance that the sealant material infiltrates the contact area between the lower mold chase and the package substrate can be reduced, and therefore a following manufacturing process can be successfully carried out.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A package substrate structure, suitable for being clipped between an upper mold chase and a lower mold chase of a package mold to perform a packaging process, and the package substrate structure comprising:
   a substrate, having a first surface, a second surface, a first patterned metal layer on the first surface and a second patterned metal layer on the second surface, wherein the second patterned metal layer is conducted to the first patterned metal layer, and the substrate is suitable for being clipped between the upper mold chase and the lower mold chase of the package mold; and
   an elastic element, disposed on the second surface and surrounding the second patterned metal layer, wherein the elastic element does not overlap with the second patterned metal layer, and the elastic element is suitable for contacting the lower mold chase and is located between the lower mold chase and the substrate.

2. The package substrate structure as claimed in claim 1, wherein a material of the elastic element is resin.

3. The package substrate structure as claimed in claim 1, wherein the upper mold chase defines a plurality of molding cavities corresponding to the containing spaces around the substrate.

4. A chip package structure, suitable for being clipped between an upper mold chase and a lower mold chase of a package mold to perform a packaging process, and the chip package structure comprising:
   a substrate, having a first surface, a second surface, a first patterned metal layer on the first surface and a second patterned metal layer on the second surface, wherein the second patterned metal layer is conducted to the first patterned metal layer, and the substrate is suitable for being clipped between the upper mold chase and the lower mold chase of the package mold;
   a plurality of chips, disposed on the first surface of the substrate in an array, and electrically connected to the first patterned metal layer, wherein the chips are suitable for being contained in a plurality of containing spaces defined by the upper mold chase and the substrate; and
   an elastic element, disposed on the second surface and surrounding the second patterned metal layer, wherein the elastic element does not overlap with the second patterned metal layer, and the elastic element is suitable for contacting the lower mold chase and is located between the lower mold chase and the substrate.

5. The chip package structure as claimed in claim 4, wherein a material of the elastic element is resin.

6. The chip package structure as claimed in claim 4, wherein the upper mold chase defines a plurality of molding cavities corresponding to the containing spaces around the substrate.

7. The chip package structure as claimed in claim 4, further comprising:
   a plurality of bonding wires, electrically connected between the chips and the first patterned metal layer.

* * * * *